(12) United States Patent
Ikenaga et al.

(10) Patent No.: US 9,147,527 B2
(45) Date of Patent: Sep. 29, 2015

(54) VARIABLE CAPACITY COMPOSITE COMPONENT

(71) Applicant: TAIYO YUDEN CO., LTD., Taito-ku, Tokyo (JP)

(72) Inventors: Tomokazu Ikenaga, Takasaki (JP); Daiki Ishii, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 159 days.

(21) Appl. No.: 14/081,863

(22) Filed: Nov. 15, 2013

(65) Prior Publication Data

US 2014/0139968 A1    May 22, 2014

(30) Foreign Application Priority Data

Nov. 16, 2012  (JP) ................. 2012-252767

(51) Int. Cl.
  *H01G 7/06* (2006.01)
  *H01L 49/02* (2006.01)
  *H01G 4/33* (2006.01)
  *H01G 4/38* (2006.01)

(52) U.S. Cl.
  CPC .................. *H01G 7/06* (2013.01); *H01L 28/55* (2013.01); *H01G 4/33* (2013.01); *H01G 4/38* (2013.01)

(58) Field of Classification Search
  CPC .............. H01G 5/40; H01G 5/38; H01G 7/06
  See application file for complete search history.

(56) References Cited

U.S. PATENT DOCUMENTS

| 2005/0104680 A1* | 5/2005 | Katta .................. 333/32 |
| 2005/0181748 A1* | 8/2005 | Ikuta et al. ............ 455/121 |
| 2006/0018082 A1* | 1/2006 | Yamagata et al. ....... 361/321.2 |
| 2009/0128249 A1* | 5/2009 | Katta ................. 333/17.1 |

FOREIGN PATENT DOCUMENTS

JP    2005-064437 A    3/2005

* cited by examiner

*Primary Examiner* — Dion R Ferguson
(74) *Attorney, Agent, or Firm* — Law Office of Katsuhiro Arai

(57) ABSTRACT

A variable capacity composite component has structures connecting four variable capacitors, for example, to signal terminals in series with bias application terminals of opposite polarities facing each other, connecting a power supply terminal to the bias+ sides of the first and second variable capacitors via a first bias resistance, and also to the bias+ sides of the third and fourth variable capacitors via a second bias resistance, connecting a grounding terminal to the bias− side of the first variable capacitor via a third bias resistance, also to the bias− sides of the second and third variable capacitors via a fourth bias resistance, and also to the bias−sides of the fourth variable capacitor via a fifth bias resistance, and setting the value of the first, second, and fourth bias resistances to one-half the value of the third and fifth bias resistances.

4 Claims, 8 Drawing Sheets

Fig. 8
(A)
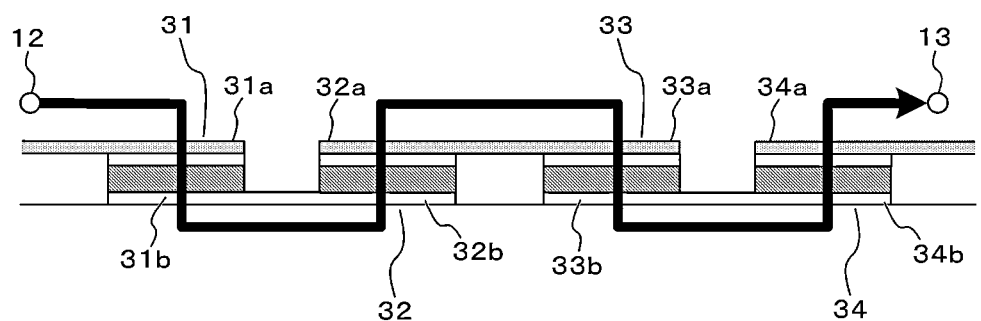
(B)
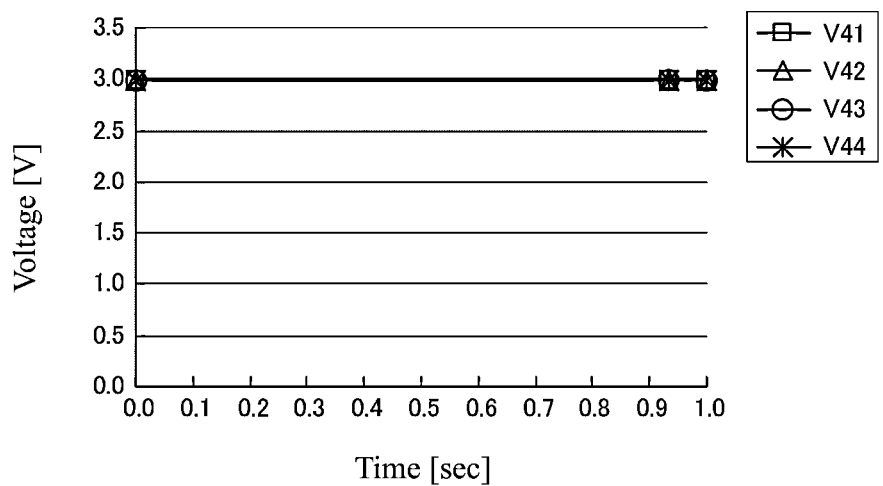

VARIABLE CAPACITY COMPOSITE COMPONENT

FIELD OF THE INVENTION

The present invention relates to a variable capacity composite component used for frequency adjustment, etc., and to an improvement of variable capacity composite component suitable for antenna frequency adjustment circuits used for NFC (near field communication), for example.

DESCRIPTION OF THE RELATED ART

For example, the NFC module used in the mobile phone chip FeliCa (registered trademark) is subject to deterioration in reception sensitivity, potentially caused by shifting of resonance frequency from the inherent value (13.56 MHz) due to variation of the antenna coil. Accordingly, a frequency adjustment circuit is incorporated and all devices are inspected prior to shipment, during which the capacity of the capacitor connected in parallel with the antenna coil is fine-tuned to correct any resonance frequency shift. A compact, low-cost composite component integrating a variable capacity element with a resistance element is desired for use in such frequency adjustment circuit.

The variable capacitor described in Patent Literature 1 below is one such variable capacity composite component for frequency adjustment. An object of this patent literature is to provide a variable capacitor capable of applying bias signals to a variable capacity element in a stable manner, characterized by compact size, easy handling, minimum waveform distortion, inter-modulation distortion, etc., excellent power resistance, and easy manufacturing, where the structure is such that a variable capacity element having a first electrode to which a first signal terminal is connected and a second electrode to which a second signal terminal is connected, a first bias line including at least one of the resistance component and inductor component connected to the first electrode, and a second bias line including at least one of the resistance component and inductor component connected to the second electrode, are formed on a support substrate.

BACKGROUND ART LITERATURES

[Patent Literature 1] Japanese Patent Laid-open No. 2005-64437

SUMMARY

However, the resistance components and inductor components included in the first bias line and second bias line are all the same in Patent Literature 1 above. As a result, the bias voltage applied to the first variable capacity element and Nth variable capacity element becomes greater than the bias voltage applied to other variable capacity elements. Since the bias voltage applied to each variable capacity element is not uniform, the inherent capacity change cannot be obtained, which presents a problem.

The present invention focuses on the aforementioned point and one object of the present invention is to provide a variable capacity composite component that realizes the inherent capacity change of each variable capacity element to the maximum possible extent and therefore achieves a high rate of change in capacity as a whole. Another object is to prevent signals from entering the bias line. Yet another object is to prevent malfunction that may be otherwise caused by local deterioration of the capacitor as a result of non-uniform application of bias voltage.

Any discussion of problems and solutions involved in the related art has been included in this disclosure solely for the purposes of providing a context for the present invention, and should not be taken as an admission that any or all of the discussion were known at the time the invention was made.

The present invention is a variable capacitor element comprising an N number of variable capacitors (where N=2n, wherein n is a natural number) arranged and connected in series on a support substrate, where each variable capacitor comprises a first electrode on the first signal terminal side and second electrode on the second signal terminal side as well as a dielectric layer sandwiched by the two electrodes and whose dielectric constant changes due to the applied voltage, wherein such variable capacity element is characterized by having: while the first electrode of one of a pair of adjacent variable capacitors is electrically connected to the second electrode of the other variable capacitor in the pair, a first bias line including a resistance component, electrically connected to the first electrode of the $2i+1^{th}$ variable capacitor (where i is a natural number equal to or smaller than n) or second electrode of the $2i^{th}$ variable capacitor from the variable capacitor on the first signal terminal side, and also connected to the first bias terminal; and a second bias line including a resistance component, electrically connected to the first electrode of the $2i^{th}$ variable capacitor or second electrode of the $2i-1^{th}$ variable capacitor from the variable capacitor on the first signal terminal side, and also connected to the second bias terminal; wherein the resistance value of other bias line is adjusted to 0.45 to 0.55 times the resistance value of the bias line connected to the first electrode of the first variable capacitor from the first signal terminal side and also connected to the first bias terminal, as well as the resistance value of the bias line connected to the second electrode of the Nth variable capacitor and also connected to the first bias terminal.

One key embodiment is characterized in that the second bias terminal is connected to the positive power supply, while the first bias terminal is grounded, to control the bias voltage. Another embodiment is characterized in that the resistance value of the bias line connected to the first electrode and second electrode is 500 kΩ or more. Yet another embodiment is characterized in that the resistance value of the bias line connected to the first electrode and second electrode is 1 GΩ or less. The aforementioned and other objects, characteristics, and benefits of the present invention are made clear from the detailed explanations below and from the drawings attached hereto.

According to the present invention, a variable capacity composite component can be provided that realizes the inherent capacity change of each variable capacitor to the maximum possible extent and therefore achieves a high rate of change in capacity as a whole. Such variable capacity composite component can also prevent signals from entering the bias line, while preventing malfunction that may be otherwise caused by local deterioration of the capacitor as a result of non-uniform application of bias voltage.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

DESCRIPTION OF THE SYMBOLS

10: Variable capacity composite component
11: Second bias terminal
12: First signal terminal
13: Second signal terminal
14: First bias terminal
21 to 25: Bias resistance
31 to 34: Variable capacitor 31a to 34a: Top electrode
31b to 34b: Bottom electrode
41 to 44: Leak resistance component
BL1: First bias line
BL2: Second bias line
100: Support substrate
102, 104: Insulation layer
W: Resistance film width

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

[FIG. 8] consists of (A) a drawing showing how variable capacitor electrodes are connected, and (B) a graph showing the voltages applied to variable capacitors 31 to 34 in a prototype.

DETAILED DESCRIPTION OF EMBODIMENTS

The best mode for carrying out the present invention is explained in detail below based on an example.

EXAMPLE 1

Figure 1:
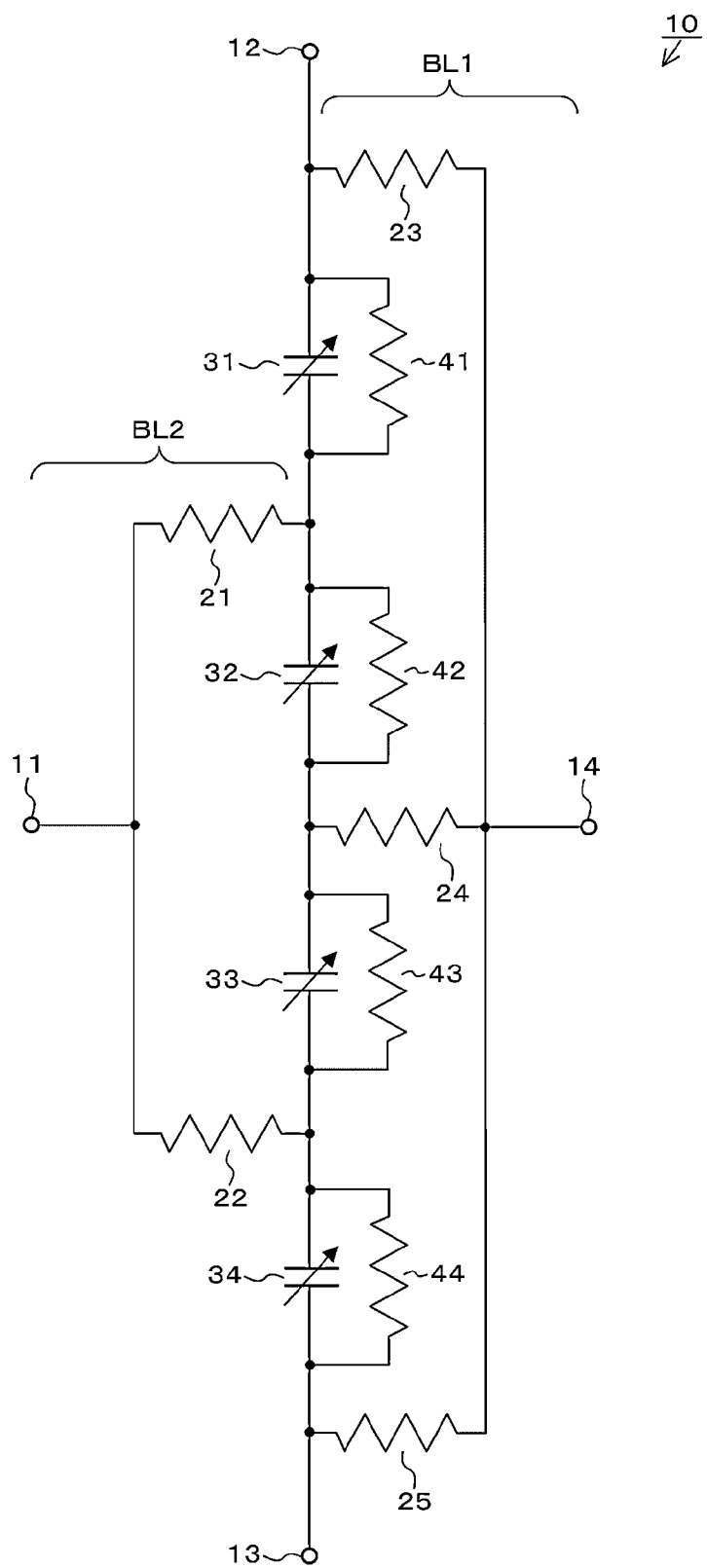
[FIG. 1] is a circuit diagram showing Example 1 of the present invention.
Figure 2:
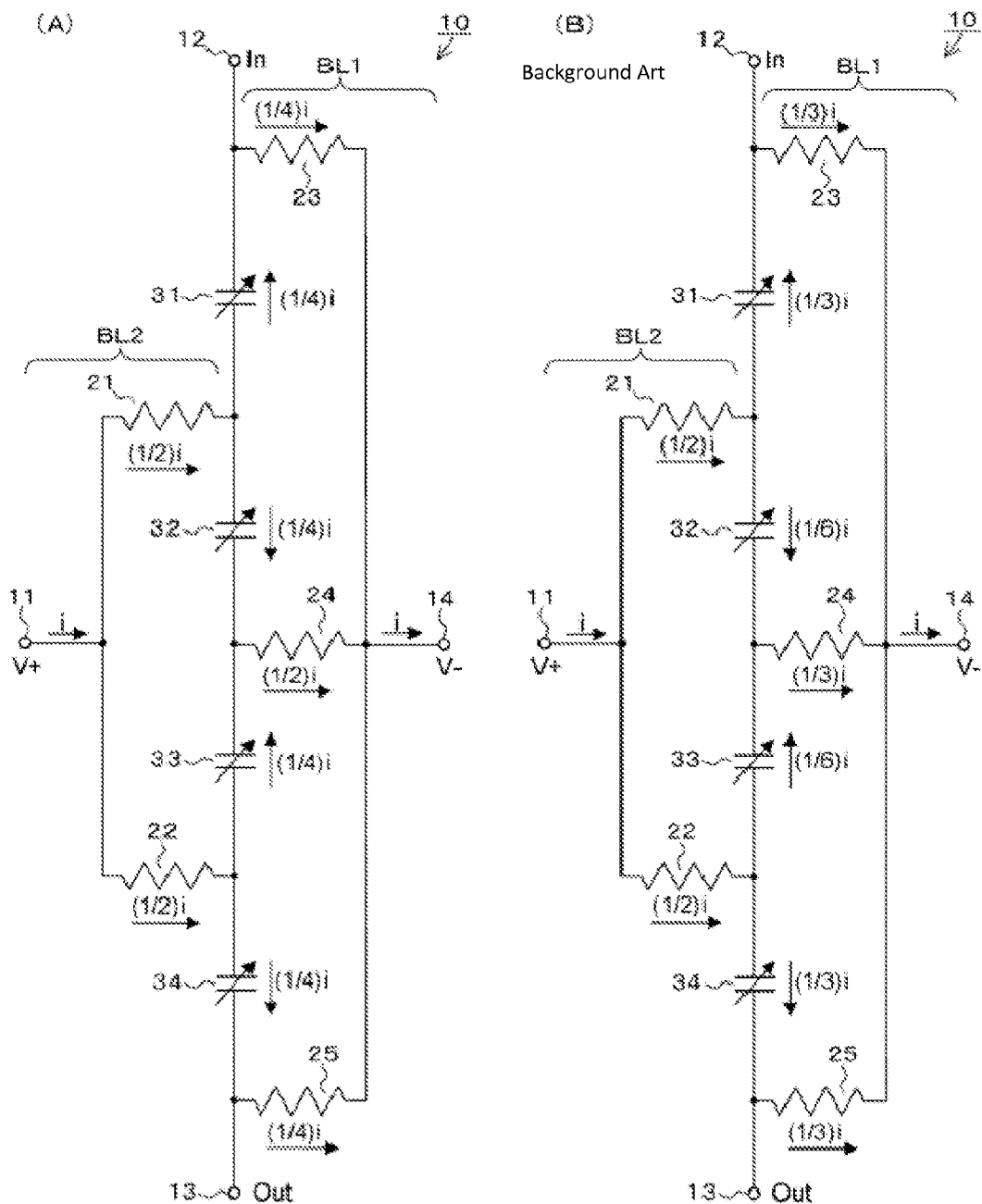
[FIG. 2] consists of two circuit diagrams showing the difference in current between (A) Example 1 and (B) the aforementioned background art.
Figure 3:
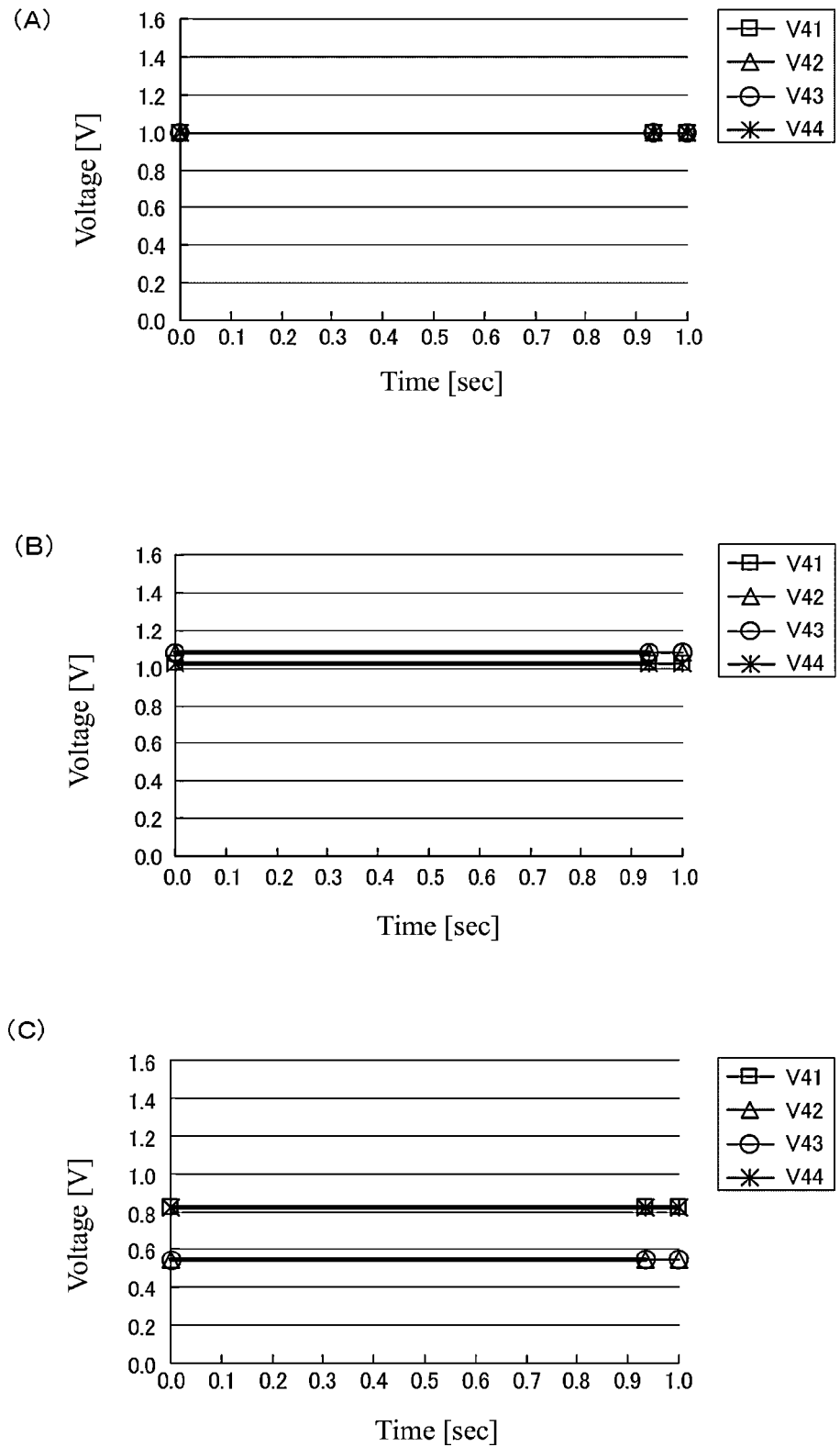
[FIG. 3] consists of three graphs showing (A) an example of the terminal voltage of the variable capacitor according to Example 1, (B) another example of the terminal voltage of the variable capacitor according to Example 1, and (C) that of the variable capacitor according to the aforementioned background art.

First, an example of the present invention is explained by referring to FIGS. 1 to 3. FIG. 1 is a drawing showing the circuit configuration of a variable capacity composite component 10 according to the present invention. In this figure, terminals 11, 14 are bias terminals, while terminals 12, 13 are signal terminals. The capacity between the terminals 12, 13 changes when the bias voltage applied between the terminals 11, 14 is changed, and the component as a whole functions as a variable capacity element as a result.

Between the first signal terminal 12 on the input side (+ side) and second signal terminal 13 on the output side (− side), four variable capacitors 31 to 34 are connected in series in such a way that the bias+ side of one capacitor faces the bias− side of the next capacitor, and the leak resistance components 41 to 44 of the variable capacitors 31 to 34 are expressed by parallel-connected resistances. The second bias terminal 11 is connected to the bias+ sides of the variable capacitors 31, 32 via a bias resistance 21, and also to the bias+ sides of the variable capacitors 33, 34 via a bias resistance 22. These bias resistances 21, 22 comprise a second bias line BL2. On the other hand, the first bias terminal 14 is connected to the bias− side of the variable capacitor 31 via a bias resistance 23, to the bias− sides of the variable capacitors 32, 33 via a bias resistance 24, and also to the bias− side of the variable capacitor 34 via a bias resistance 25. These bias resistances 23 to 25 comprise a first bias line BL1.

In this example, the value of the bias resistances 21, 22 of the second bias line BL2 and bias resistance 24 of the first bias line BL1 are set to 0.5 R corresponding to one-half the value R of the bias resistances 23, 25 of the first bias line BL1. The reason is explained below:

a. The bias resistances 23, 25 are connected directly to the signal terminals 12, 13, respectively, and therefore affected significantly by the communication signals. Accordingly, preferably the resistance value is considerably higher than the impedance of the variable capacitors 31 to 34 at the signal frequency in order to prevent communication signals from entering the first bias line BL1.

b. In terms of circuit configuration, preferably the value of the bias resistance 24 connected to the two variable capacitors 32, 33 is around one-half the value of the bias resistance 23 connected only to the variable capacitor 31 in order to have a uniform bias voltage applied to the variable capacitors 31 to 34. The same goes with the bias resistance 25.

c. Preferably the composite resistance on the power supply side is identical to the composite resistance on the grounding side in order to maintain a uniform resistance of the entire circuit along the bias lines BL1, BL2.

It should be noted that, although the value of the bias resistances 21, 22, 24 is adjusted to 0.5 R, or one-half the value of the bias resistances 23, 25, each resistance inevitably varies in reality. So long as the degree of variation is minimal, the applied bias voltage is not affected much and, by thus ignoring some variation, a range of 0.45 R to 0.55 R is acceptable. This condition holds even when the number of variable capacitor elements is increased from 4 based on series connection as shown in the figure to 6 based on series connection, or even 8 based on series connection, and if all resistances included in the bias lines have the same value, the non-uniformity of applied bias voltage relative to each variable capacitor will increase as the number of series elements increases. To be specific, there will be two applied bias voltage patterns when four elements are connected in series, three patterns when six elements are connected in series, and four patterns when eight elements are connected in series. Non-uniformity of applied bias voltage not only affects the stability of the rate of change in capacity, but it also causes only some variable capacitors to be loaded, thereby increasing the chances of malfunction.

Next, in this example, the second bias terminal 11 on the second bias line BL2 side is used as the power supply terminal that applies positive voltage, while the first bias terminal 14 on the first bias line BL1 side is used as the grounding terminal, to control the bias voltage. This way, the bias+ side of each of the variable capacitors 31 to 34 represents positive voltage, while the current flowing through each of the variable capacitors 31 to 34 is limited by the leak characteristics at the interface of the bias– side and dielectric material, and consequently high voltage resistance can be achieved with respect to the DC bias.

Desirably the value of each of the bias resistances 21 to 25 included in the bias lines BL1, BL2 is 500 kΩ or more. In the case of NFC, for example, the communication frequency range corresponds to the frequency band of 10 to 20 MHz. If, in this band, the equivalent impedance value of the variable capacity composite component becomes equal to or greater than the value of the bias resistances 21 to 25 included in the bias lines BL1, BL2, then communication signals enter the bias lines BL1, BL2 and the communication circuit can no longer function as such. From this point, preferably the resistance value is set to at least 10,000 times the impedance value of the variable capacity composite component operating in the 10-MHz band, as a condition for preventing entry of communication signals. For example, assume that the capacity of the variable capacity composite component is 400 pF. Since the impedance at a frequency of 13.56 MHz is approx. 30Ω, the value of each of the bias resistances 21 to 25 should be 300 kΩ or more.

However, if the value of each of the bias resistances 21 to 25 included in the bias lines BL1, BL2 is too high and reaches the equivalent resistance value calculated from the leak current amounts of the variable capacitors 31 to 34 or values of the leak resistance components 41 to 44, then the bias voltage applied to the variable capacitors 31 to 34 will drop due to a voltage drop resulting from these leak resistance components 41 to 44. From this point, preferably the values of bias resistances 21 to 25 are set at or less than one-fiftieth of the leak resistance components 41 to 44 of the variable capacitors 31 to 34 in order to achieve sufficient application of bias voltage to the variable capacitors 31 to 34. Since the leak resistance components 41 to 44 are approx. 50 GΩ, the resistance values of bias resistances 21 to 25 should be 1 GΩ or less.

Next, the operations of this example are explained by also referring to FIGS. 2 and 3. Here the leak resistance components 41 to 44 are omitted in FIG. 2. (A) in FIG. 2 shows the flow of current in this example, where, because of the aforementioned setting of bias resistance values, all of the currents flowing through the variable capacitors 31 to 34 are identical. To be specific, when the current flowing through the second bias terminal 11 of the second bias line BL2 is given as i, then the current flowing through the bias resistances 21, 22 becomes (1/2)i, while the current flowing through each of the variable capacitors 31 to 34 becomes (1/4)i. On the other hand, while the current flowing through the bias resistances 23, 25 of the first bias line BL1 is (1/4)i, the current flowing through the bias resistance 24 becomes (1/2)i and the current flowing through the first bias terminal 14 becomes i.

On the other hand, if all of the bias resistances 21 to 25 have the same value, as is the case of the aforementioned prior art, then the currents flowing through the variable capacitors 31 to 34 are no longer identical and non-uniform capacity changes occur, as shown in (B) in FIG. 2. In other words, the current flowing through the variable capacitors 31, 34 becomes (1/3)i, while the current flowing through the variable capacitors 32, 33 becomes (1/6)i. In addition, while the same current (1/2)i flows through the bias resistances 21, 22 of the second bias line BL2, the same current (1/3)i flows through all of the bias resistances 23 to 25 of the first bias line BL1.

FIG. 3 shows an example where the variable capacitors 31 to 34 have terminal voltages (potential differences) of V41 to V44. (A) in FIG. 3 represents this example where a bias voltage of 3 V is applied to the power supply terminal 11 when the value of the bias resistances 21, 22, 24 is 25 GΩ, value of the bias resistances 23, 25 is 50 GΩ, and leak resistance components 41 to 44 are 50 GΩ, and as shown in this figure, the terminal voltages V41 to V44 of variable capacitors 31 to 34 show good agreement.

Compared to (A) in FIG. 3, (B) in FIG. 3 shows a case where the value of the bias resistances 21, 22, 24 has been changed from 25 GΩ to 22.5 GΩ. Although the terminal voltages V41 to V44 of variable capacitors 31 to 34 are slightly different, the differences are all within an acceptable margin of error. In other words, there is an error of 0.05 V among voltages V41 to V44, which is approx. 5% of the case in (A) in FIG. 3, or 0.7% in equivalent capacity change.

(C) in FIG. 3 is the same as the case in (B) in FIG. 2 above, but where a bias voltage of 3 V is applied to the power supply terminal 11 when the value of the bias resistances 21 to 25 is 50 GΩ and leak resistance components 41 to 44 are 50 GΩ. As shown in this figure, there is a relationship of V41, V44>V42, V43, and the difference is large.

Based on the above, in this example where the values of the bias resistances 21 to 25 included in the bias lines BL1, BL2 are adjusted to achieve uniform voltage/current for the variable capacitors 31 to 34, the inherent capacity change of each element can be realized to the maximum possible extent and consequently a variable capacity composite component realizing a large rate of change in capacity as a whole can be provided. In addition, entry of signals into the bias lines BL1, BL2 is prevented because the values of bias resistances 21 to 25 are set in consideration of the impedance of the variable capacity composite component. Furthermore, malfunction otherwise caused by non-uniform application of bias voltage among the variable capacitors 31 to 34 is prevented because the values of bias resistances 21 to 25 are also set in consideration of the values of the leak resistance components 41 to 44 of the variable capacitors 31 to 34.

Figure 4:
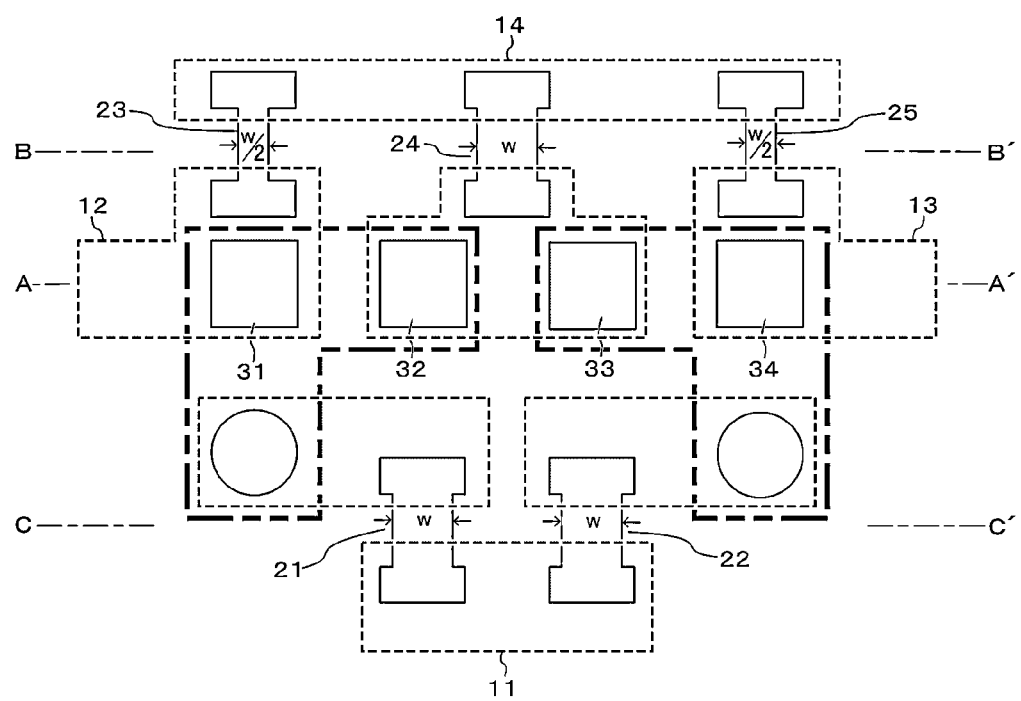
[FIG. 4] is a drawing showing how key parts are overlapped.
Figure 5:
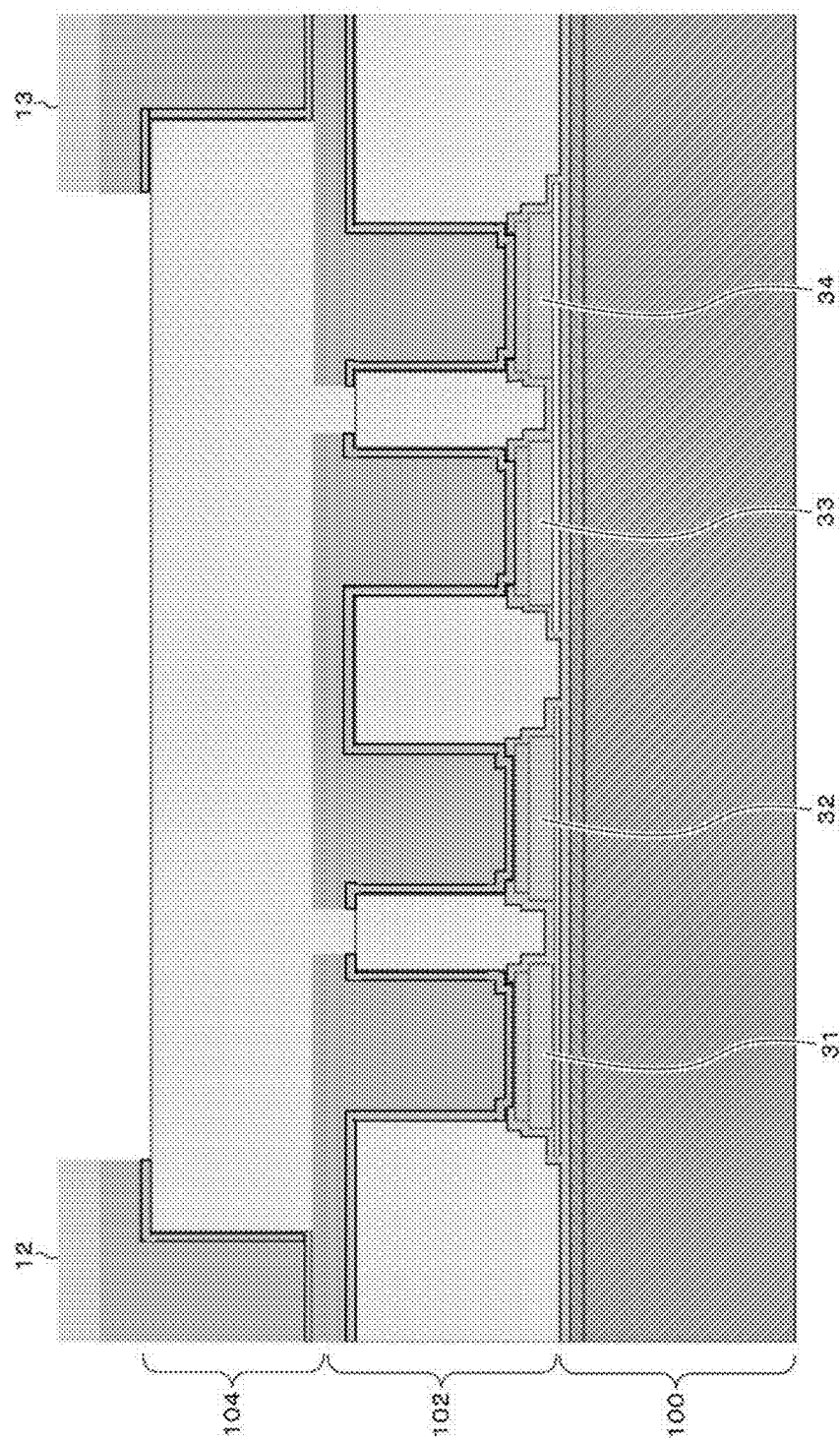
[FIG. 5] is a section view of the variable capacitor in FIG. 4, cut along line A-A'.
Figure 6:
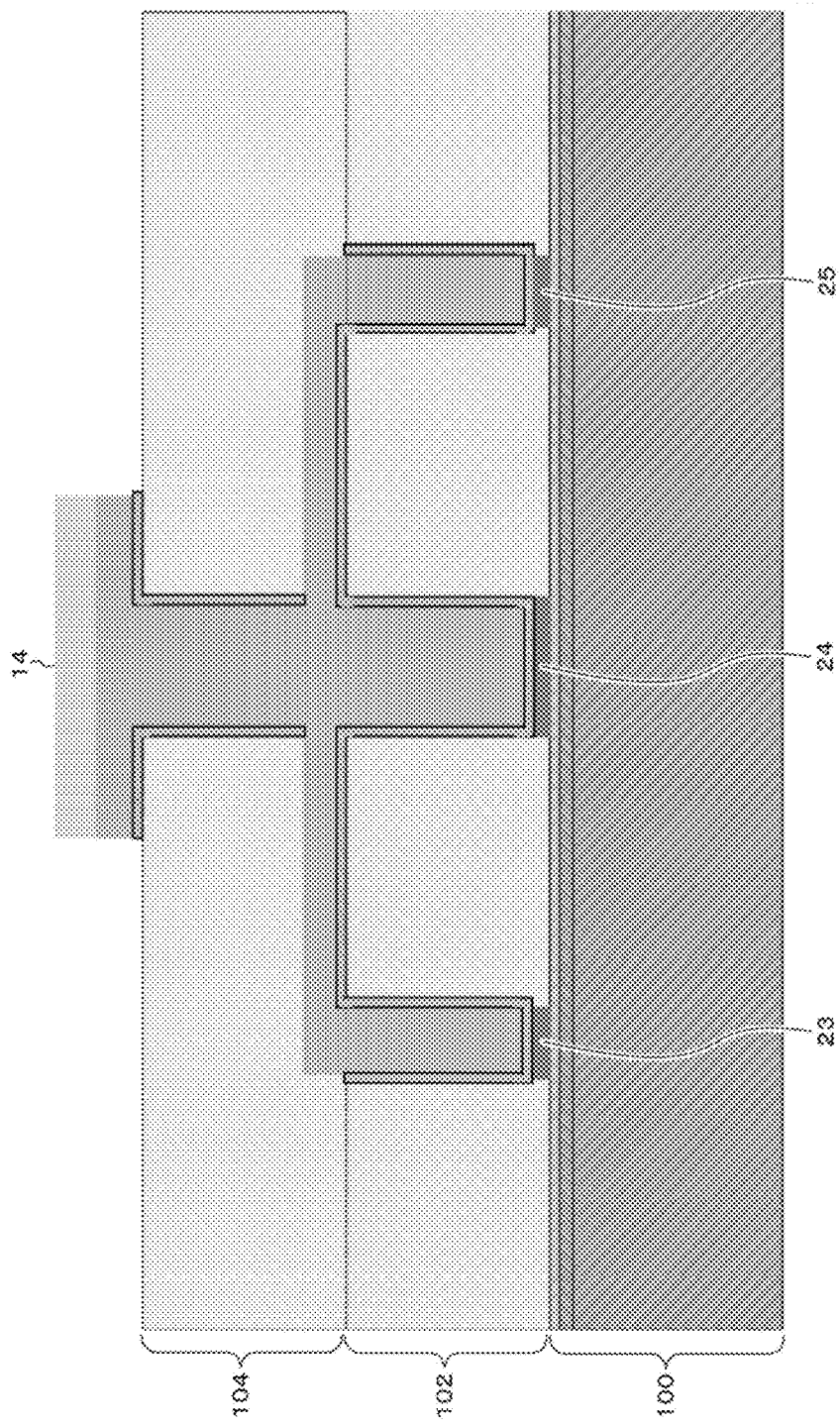
[FIG. 6] is a section view of the first bias line in FIG. 4, cut along line B-B'
Figure 7:
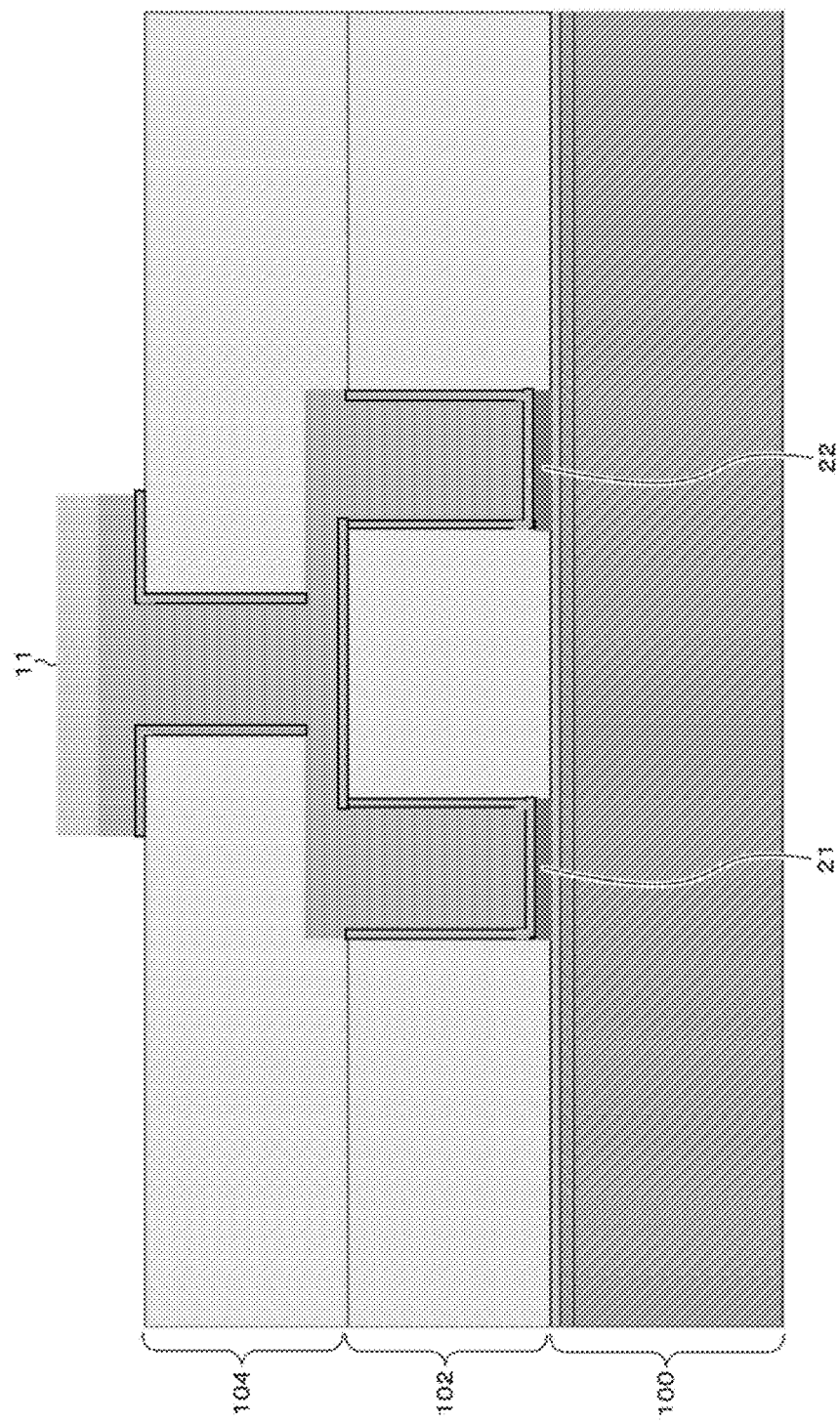
[FIG. 7] is a section view of the second bias line in FIG. 4, cut along line C-C'

Next, an example of the specific component structure in Example 1 above is explained by referring to FIGS. 4 to 7. FIG. 4 shows how key parts are overlapped, with the two-dot chain line (in bold) representing the bottom electrode pattern and the dotted line representing the top electrode pattern. Also, FIG. 5 is a section view of the variable capacitor of FIG. 4 cut along line A-A', FIG. 6 is a section view of the first bias line cut along line B-B', and FIG. 7 is a section view of the second bias line cut along line C-C', respectively.

In FIGS. 5 to 7, a support substrate 100 uses a Si substrate with SiO$_2$ thermal oxide film. However, the substrate material is not limited to the foregoing and an insulation substrate made of quartz, alumina, sapphire, glass, etc., may be used or a Si or other conductive substrate (preferably one of high resistance) with an insulation film layer formed on top may also be used. Furthermore, Al$_2$O$_3$ film may be formed on top of the SiO$_2$ film for the purpose of protection against entry of hydrogen. SiN, Ta$_2$O$_5$, SrTiO$_3$, or other film may be formed alone or stacked instead of Al$_2$O$_3$ film. The film thickness may be 400 μm for Si substrate, 1 μm for SiO$_2$ film, and 100 nm for Al$_2$O$_3$ film, for example.

Next, with reference to the variable capacitor in FIG. 5, a bottom electrode is formed with Pt, for example, on the main side of the support substrate 100. A Ti film layer or TiO$_2$ film layer may be formed below Pt as a layer contacting the support substrate 100. It should also be noted that, for the electrode material, any conductive oxide such as SrRuO$_3$, RuO$_2$, or IrO$_2$ may be used in addition to Pt as mentioned above, Ir, Ru, or other precious metal. On the bottom electrode, a dielectric layer having variable capacity characteristics is formed. For example, BST (BaSrTiO$_3$), BST containing a trace amount of Mn, PZT (PZrTiO$_3$), or other oxide of perovskite structure may be used, among others. On the dielectric layer, a top electrode is formed with Pt. In addition to Pt, Ir, Ru, or other precious metal or SrRuO$_3$, RuO$_2$, IrO$_2$, or other conductive oxide may be used. The thickness may be 250 nm for top electrode Pt, 100 nm for BST, and 250 nm for bottom electrode Pt, for example. It should be noted that the variable capacitor 31 and variable capacitor 32 share the same bottom electrode, while the variable capacitor 33 and variable capacitor 34 also share the same bottom electrode. As for the bottom electrode shared by the variable capacitor 31 and variable capacitor 32, it occupies the position on the second signal terminal 13 side and thus represents the second electrode for the variable capacitor 31, while occupying the position on the first signal terminal 12 side and thus representing the first electrode for the variable capacitor 32. Similarly regarding the bottom electrode shared by the variable capacitor 33 and variable capacitor 34, it occupies the position on the second signal terminal 13 side and thus represents the second electrode for the variable capacitor 33, while occupying the position on the first signal terminal 12 side and thus representing the first electrode for the variable capacitor 34.

In the case of the mobile phone FeliCa (registered trademark), for example, the best capacity value for the purpose of frequency adjustment is 100 pF at 13.56 MHz. This means that, when four variable capacitors 31 to 34 are connected in series, the capacity value of each capacitor should be 400 pF.

Incidentally, preferably the four variable capacitors 31 to 34 are arranged in alternating reverse polarities, as shown in (A) in FIG. 8. In other words, preferably the variable capacitors 31 to 34 are connected in the moving direction of the signal in such a way that each capacitor is oriented in the opposite direction to the next capacitor, as in "First signal terminal 12→Top electrode 31a of variable capacitor 31→Dielectric layer→Bottom electrode 31b→Bottom electrode 32b of variable capacitor 32→Dielectric layer→Top electrode 32a→Top electrode 33a of variable capacitor 33→Dielectric layer→Bottom electrode 33b→Bottom electrode 34b of variable capacitor 34→Dielectric layer→Top electrode 34a→Second signal terminal 13." This is effective because by the bottom electrodes 31b to 34b formed on a relatively smooth surface (support substrate 100) and the top electrodes 31a to 34a formed on a relatively rough surface (dielectric layer), any potential polarities resulting from differences in leak current characteristics are cancelled out.

Next, with reference to the bias lines in FIGS. 6 and 7, Ta—SiN film is formed as a resistance layer on the bias resistances 21 to 25 and leader electrodes are formed on both ends of the film. In addition to the foregoing, Ni—Cr alloy, Fe—Cr—Al alloy or other high-resistance film may also be used. Incidentally, the value of the bias resistances 21, 22, 24 is set to 0.45 to 0.55 times the value of the bias resistance 23, 25 in this example, as mentioned above. Possible factors based on which to adjust the resistance value of resistance film include width, length, thickness, and material of film, but in this example, the width at the center of resistance film is adjusted. In the example shown in FIG. 4, the center width of the bias resistances 23, 25 is set to W/2, where W represents the center width of the bias resistances 21, 22, 24. Under the method of adjusting the resistance value according to the length of resistance film, wiring at the center of resistance film may become extremely short and present machining accuracy problems. If the resistance layer has a sufficient length at both ends of the signal wire, however, the length of resistance film at the center may be adjusted to between 0.45 and 0.55 times the length of the resistance layer at the ends.

For example, when the resistance value of the bias resistances 21, 22, 24 is 20 MΩ and the resistance value of the bias resistances 23, 25 is 40 MΩ, then the width of the resistance wire created over a length of 0.02 mm may be adjusted to 0.02 mm for the bias resistances 21, 22, 24 and 0.01 mm for the bias resistances 23, 25.

Next, for insulation layers 102, 104 formed on the support substrate 100 as electrode leaders, 3 μm polyimide is used, for example. In addition to the foregoing, SiO$_2$, SiN or other inorganic insulation film, or polyimide resin, BCB resin or other organic insulation film, may also be used. For the seed layer/barrier layer (contact layer) with which to form the electrode leader, Cu/TaN (Ta) is used. For the seed layer, material appropriate for the material of the terminal electrode to be led must be selected. For the barrier layer (contact layer), other options include Ti, TiN, TaN, TiSiN, TaSiN, and other nitrides, and SrRuO$_3$, IrO$_2$, and other oxides, among others. The leader electrode to be connected to the electrode leader uses 3 μm Cu here, but Al or any of various other conductive materials may be used. In addition, while 5 μm Sn—Ag is used for the terminal electrode on top of the leader electrode, Al—Cu alloy, Au, solder material, etc., may be used depending on the mounting method.

Next, (B) in FIG. 8 is a graph of the voltages applied to the variable capacitors 31 to 34 comprising the variable capacity composite component having the structure described above. This graph shows the potential differences between both ends generating on the variable capacitors 31 to 34 when a bias voltage of 3 V is applied to the second bias terminal 11, provided that the resistance value of the bias resistances 21, 22, 24 is 20 MΩ, resistance value of the bias resistances 23, 25 is 40 MΩ, and resistance value of the leak resistance components 41 to 44 is 50 GΩ, and as shown in this figure, a uniform voltage of 3 V is applied to all of the variable capacitors 31 to 34.

It should be noted that the present invention is not at all limited to the aforementioned example, and various changes may be added so long as they do not deviate from the key points of the present invention. For example, the present invention also includes the following:

(1) There are four variable capacitors in the aforementioned example, but generally the present invention can be applied in the same manner so long as there are an even number (N=2n, where n is a natural number) of variable capacitors.

(2) The present invention is explained primarily based on use for frequency adjustment in the aforementioned example, but the present invention can be applied to various circuits requiring variable capacity.

According to the present invention, a variable capacity composite component can be obtained that realizes the inherent capacity change of each variable capacity element to the maximum possible extent and therefore achieves a high rate of change in capacity as a whole, which works favorably for frequency adjustment circuits, etc.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, an article "a" or "an" may refer to a species or a genus including multiple species, and "the invention" or "the present invention" may refer to at least one of the embodiments or aspects explicitly, necessarily, or inherently disclosed herein. In this disclosure, any defined meanings do not necessarily exclude ordinary and customary meanings in some embodiments.

The present application claims priority to Japanese Patent Application No. 2012-252767, filed Nov. 16, 2012, the disclosure of which is incorporated herein by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A variable capacity composite component which is a variable capacitor element comprising an N number of variable capacitors (where $N = 2n$, wherein n is a natural number) arranged and connected in series on a support substrate, where each variable capacitor comprises a first electrode on a first signal terminal side and a second electrode on a second signal terminal side as well as a dielectric layer sandwiched by the two electrodes and whose dielectric constant changes due to an applied voltage, said variable capacity composite component having:

while the first electrode of one of a pair of adjacent variable capacitors is electrically connected to the second electrode of the other variable capacitor in the pair, a first bias line including a resistance component, electrically connected to the first electrode of a $2i+1t'$ variable capacitor (where i is a natural number equal to or smaller than n) or second electrode of a 2ith variable capacitor from the variable capacitor on the first signal terminal side, and also connected to the first bias terminal; and a second bias line including resistance component, electrically connected to the first electrode of a 2ith variable capacitor or second electrode of a $2i-1t'$ variable capacitor from the variable capacitor on the first signal terminal side, and also connected to the second bias terminal;

wherein a resistance value of the second bias line is adjusted to 0.45 to 0.55 times a resistance value of the first bias line connected to the first electrode of a first variable capacitor from the first signal terminal side and also connected to the first bias terminal, as well as a resistance value of the first bias line connected to the second electrode of an Nth variable capacitor and also connected to the first bias terminal.

2. A variable capacity composite component according to claim 1, wherein the second bias terminal is connected to a positive power supply, while the first bias terminal is grounded, to control a bias voltage.

3. A variable capacity composite component according to claim 1, wherein the resistance value of the bias lines connected to the first electrode and second electrode is 500 k$\Omega$ or more.

4. A variable capacity composite component according to claim 1, wherein the resistance value of the bias lines connected to the first electrode and second electrode is 1 G$\Omega$ or less.

* * * * *

UNITED STATES PATENT AND TRADEMARK OFFICE
CERTIFICATE OF CORRECTION

PATENT NO. : 9,147,527 B2  
APPLICATION NO. : 14/081863  
DATED : September 29, 2015  
INVENTOR(S) : Tomokazu Ikenaga and Daiki Ishii Page 1 of 1

It is certified that error appears in the above-identified patent and that said Letters Patent is hereby corrected as shown below:

In the claims

At column 9, line 31, in Claim 1, in "2i+1t' variable", please delete "1t'" and insert therefor --$1^{th}$--.

At column 10, line 2, in Claim 1, in "second electrode of a 2ith variable capacitor", please delete "2ith" and insert therefor --$2i^{th}$--.

At column 10, line 6, in Claim 1, in "the first electrode of a 2ith variable", please delete "2ith" and insert therefor --$2i^{th}$--.

At column 10, line 7, in Claim 1, in "1 t' variable capacitor", please delete "1 t'" and insert therefor --$1^{th}$--.

Signed and Sealed this  
Twenty-third Day of February, 2016

Michelle K. Lee  
*Director of the United States Patent and Trademark Office*